(12) United States Patent
Toncich et al.

(10) Patent No.: US 7,522,016 B2
(45) Date of Patent: Apr. 21, 2009

(54) TUNABLE SURFACE ACOUSTIC WAVE RESONATORS

(75) Inventors: Stanley Slavko Toncich, San Diego, CA (US); Aracely Williams, San Diego, CA (US); Raymond C. Wallace, San Diego, CA (US); Soon-Seng Lau, San Diego, CA (US); Steven C. Ciccarelli, Ramona, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 93 days.

(21) Appl. No.: 11/227,632

(22) Filed: Sep. 14, 2005

(65) Prior Publication Data

US 2006/0109064 A1    May 25, 2006

Related U.S. Application Data

(60) Provisional application No. 60/610,327, filed on Sep. 15, 2004.

(51) Int. Cl.
*H03H 9/72* (2006.01)
*H03H 9/64* (2006.01)

(52) U.S. Cl. ...................... 333/133; 333/193
(58) Field of Classification Search ............. 333/188, 333/193, 133
See application file for complete search history.

(56) References Cited

U.S. PATENT DOCUMENTS

| | | | | |
|---|---|---|---|---|
| 3,170,120 A | * | 2/1965 | Jensen et al. | 330/117 |
| 3,881,137 A | * | 4/1975 | Thanawala | 361/113 |
| 3,973,149 A | * | 8/1976 | Vale et al. | 310/360 |
| 5,166,646 A | * | 11/1992 | Avanic et al. | 331/107 A |
| 5,789,845 A | * | 8/1998 | Wadaka et al. | 310/334 |
| 5,933,062 A | * | 8/1999 | Kommrusch | 333/193 |
| 6,150,903 A | * | 11/2000 | Asakawa et al. | 333/189 |
| 6,525,624 B1 | * | 2/2003 | Hikita et al. | 333/133 |
| 7,030,718 B1 | * | 4/2006 | Scherer | 333/188 |
| 2005/0174199 A1 | * | 8/2005 | Carpentier et al. | 333/188 |

FOREIGN PATENT DOCUMENTS

| | | | | |
|---|---|---|---|---|
| JP | 57007615 | | 1/1982 | |
| JP | 2-105705 | * | 4/1990 | 331/154 |
| JP | 04035516 | | 5/1990 | |

OTHER PUBLICATIONS

Oebybyrum D. et al: "A Tunable Saw Duplexer". Utrasonics Sympsium. 2000 IEEE. Oct. 22, 2000. pp. 361-366.
International Search Report-PCT/US2005/033259, International Search Authority, European Patent Office-Dec. 28, 2005.
Written Opinion-PCT/US2005/033259, International Search Authority, European Search Report-Mar. 15, 2007.
International Preliminary Examination Report-PCT/us2005/033259, International Search Authority, European Search Office-Mar. 20, 2007.

* cited by examiner

*Primary Examiner*—Barbara Summons
(74) *Attorney, Agent, or Firm*—Nicholas J. Pauley; William M. Hooks; Katherine Umpleby

(57) ABSTRACT

A tunable SAW resonator circuit is disclosed. The tunable SAW resonator circuit includes a SAW resonator having a Q, a resistor coupled to the SAW resonator to reduce the Q, and a tuning component coupled to the SAW resonator to tune the SAW resonator. A method to tune the SAW resonator is also disclosed. The SAW resonator may be tuned by applying a control signal to the tuning component.

15 Claims, 5 Drawing Sheets

TUNABLE SURFACE ACOUSTIC WAVE RESONATORS

The present application for Patent claims priority to Provisional Application No. 60/610,327 entitled "Low Q factor surface acoustic resonator (SAW) design for the purpose of enabling frequency tunability" filed Sep. 15, 2004, and assigned to the assignee hereof and hereby expressly incorporated by reference herein.

FIELD

The present disclosure relates generally to the electronics field, and more specifically, to tunable Surface Acoustic Wave (SAW) resonators.

BACKGROUND

A Surface Acoustic Wave (SAW) is an acoustic wave that propagates along the surface of a substrate. This principle has been commonly employed in SAW resonators. A SAW resonator is constructed with interdigital transducers (IDT) that provide a conversion medium between electric signals and surface waves. The SAW resonator is often constructed with an input IDT that generates a SAW from an electric signal, and an output IDT that detects the SAW traveling along the surface of the substrate. The frequency of the SAW resonator is based on the physical layout of the IDT and the velocity of the acoustic wave. The velocity of the acoustic wave is a function of the substrate material.

SAW resonators are inherently high Q components, and therefore, make excellent, compact size, band pass filters for wireless communication devices. Their primary drawback, however, is their inability to be tuned by means of an external voltage variable capacitor. As a result, multi-band wireless handsets using SAW resonators typically require a separate channel for each operating band. Each channel includes transmit and receive filters coupled to a duplexer. Various switches are also needed to switch the selected channel to the antenna. As the number of desired bands increase, the cost and complexity of realizing a multi-band wireless handset with SAW resonators becomes prohibitive. Accordingly, there is a need in the art for a frequency agile SAW resonator. In wireless applications, frequency agile SAW resonators will enable wireless handsets to operate at multiple bands using a single channel. This will reduce power consumption, extend battery life, and reduce the size and cost of the wireless handset.

SUMMARY

One aspect of a tunable SAW resonator circuit is disclosed. The tunable SAW resonator circuit includes a SAW resonator having a Q, a resistor coupled to the SAW resonator to reduce the Q, and a tuning component coupled to the SAW resonator to tune the SAW resonator.

Another aspect of a tunable SAW resonator circuit is disclosed. The tunable SAW resonator circuit includes a SAW resonator, and means for tuning the SAW resonator.

One aspect of a transceiver is disclosed. The transceiver includes a receiver, a transmitter, and a duplexer coupled to the receiver and transmitter. The transmitter or receiver includes a tunable SAW resonator.

Another aspect of the transceiver is disclosed. The transceiver includes a receiver, a transmitter, and a duplexer having a transmit filter coupled to the transmitter and a receiver filter coupled to the receiver, each of the filters having a tunable SAW resonator.

A method of tuning a SAW resonator in a circuit is disclosed. The circuit includes a resistor coupled to the SAW resonator to reduce the Q. The method includes generating a control signal, and tuning the SAW resonator with the control signal.

It is understood that other embodiments of the present invention will become readily apparent to those skilled in the art from the following detailed description, wherein various embodiments of the invention are shown and described by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

DETAILED DESCRIPTION

The detailed description set forth below in connection with the appended drawings is intended as a description of various embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention.

The applications for a tunable SAW resonator are vast in the electronics field. In a wireless transceiver, for example, tunable SAW resonators may be used in a variety of processing stages including the antenna duplexer, the RF filters in the front-end of the transceiver, the intermediate frequency (IF) filters, and the baseband filters. These resonators may be constructed as high pass filters, low pass filters, band pass filters, notch filters, or any other type of filters that might be required by the wireless transceiver. Tunable SAW resonators may also be used in wireless transceivers to implement voltage controlled oscillators and variable delay lines. Applications outside wireless transceivers extend to medical devices, automotive and industrial equipment, pagers, and just about every other device that requires a filter, oscillator, and/or delay line.

Various applications of SAW resonators will be described in detail below in the context of a wireless transceiver. While these SAW resonators may be well suited for use in this application, those skilled in the art will readily recognize the applicability in other communication and/or electronic devices. Accordingly, any reference to a wireless transceiver, or a particular application of the wireless transceiver, is intended only to illustrate the inventive aspects of the tunable SAW resonators, with the understanding that such aspects have a wide range of applications.

Figure 1:
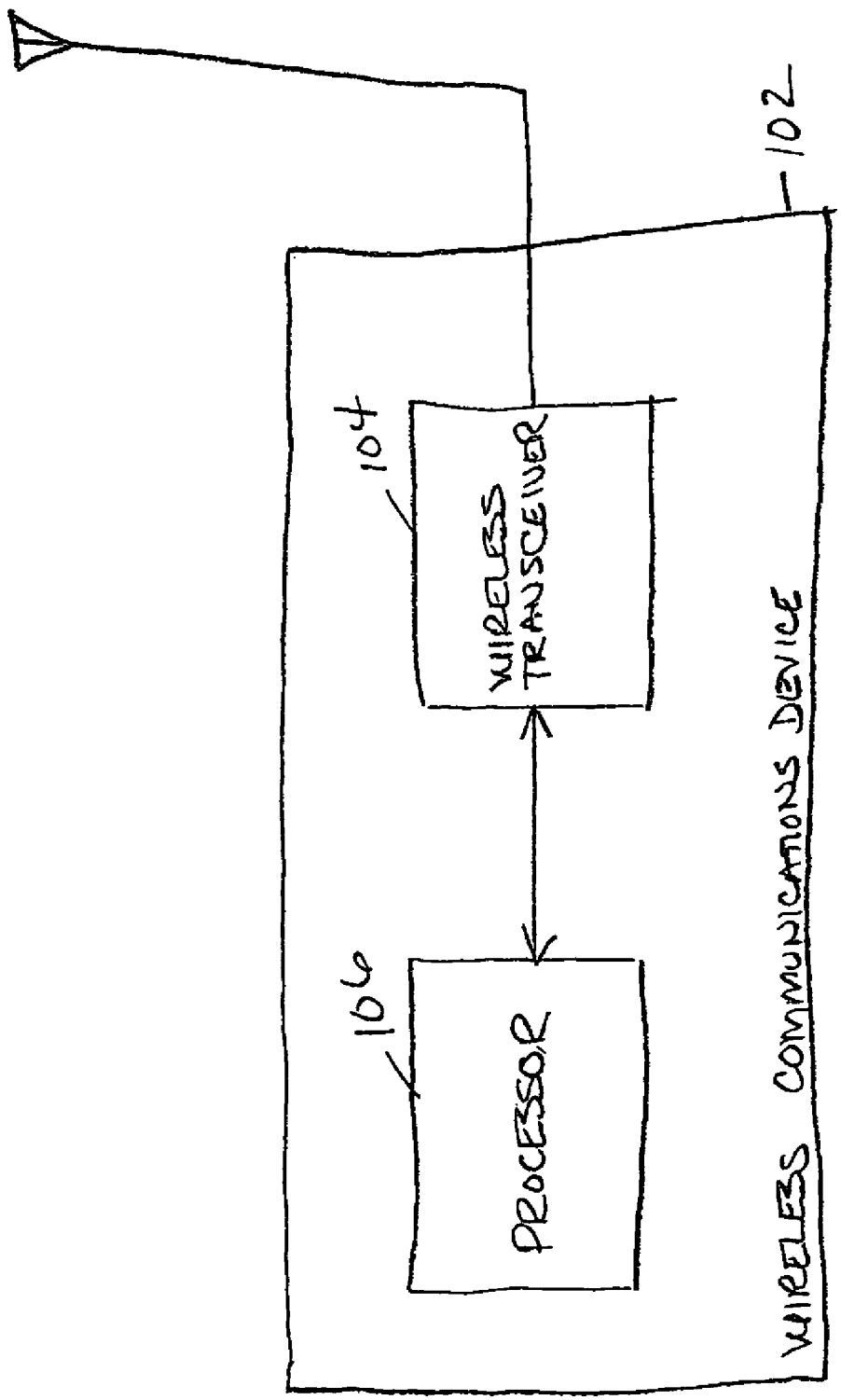
FIG. 1 is a functional block diagram of a wireless communications device.

FIG. 1 is a functional block diagram of a wireless communications device 102. The wireless communications device 102 may be a telephone, desktop computer, laptop computer, personal digital assistant (PDA), pager, modem, digital camera, game console, broadcast equipment, video conferencing equipment, or any other suitable device. In at least one embodiment, the wireless communications device 102 is a multi-band device designed to communicate over a CDMA (Code Division Multiple Access) network in the United States using cellular, PCS (Personal Communications Services), or IMT (International Mobile Telecommunications) services. The wireless communications device 102 may also be capable of utilizing wireless services abroad, such as cellular services in Japan and PCS in Korea.

The wireless communications device 102 may include a wireless transceiver 104 employing one or more SAW resonators (not shown) at different processing stages. A processor 106 may be used to manage the wireless transceiver, as well as providing various signal processing function such as coding, modulation and spread-spectrum processing. The management functions provided by the processor 106 may include tuning the SAW resonators in the wireless transceiver 104 to provide access to various wireless services supported by the network. When a user initiates a call, the processor 106 may be used to access a roaming map to determine the appropriate wireless service. Depending on the geographic location of the user and the service provider, the processor 104 may select a wireless service from the roaming map and attempt to acquire the network using that service. As part of the acquisition process, the processor 106 tunes the SAW resonators to operate the wireless transceiver at the frequency band required to support the selected service.

Figure 2:
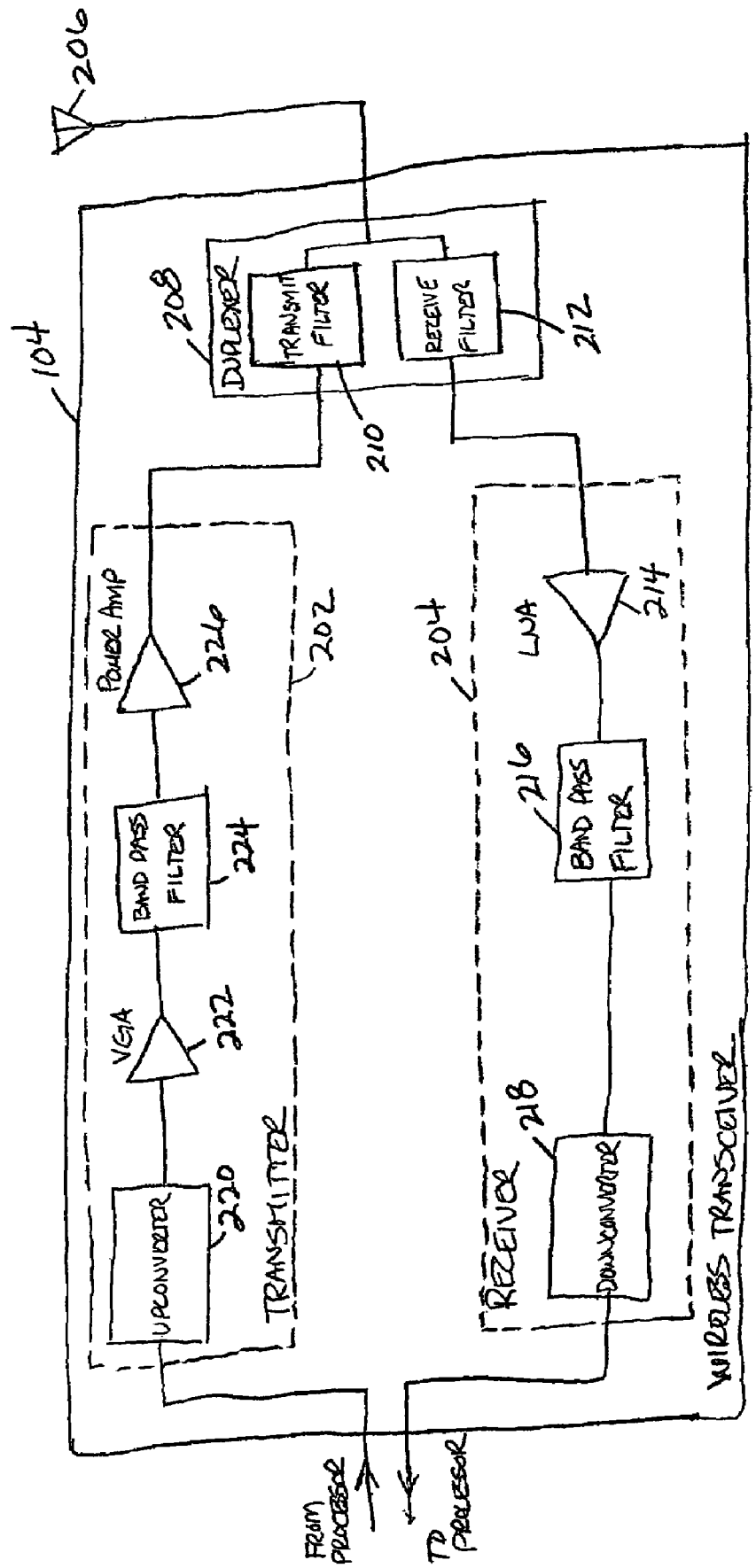
FIG. 2 is a functional block diagram of a wireless transceiver employing multiple SAW resonators.

FIG. 2 is a functional block diagram of a wireless transceiver employing multiple SAW resonators. The wireless transceiver 104 is shown in simplified form to emphasize the inventive concepts without unnecessary detail. The actual implementation of the wireless transceiver 104 will be more complex, and may include, by way of example, a complex (I-Q) architecture, which is well known in the art. In addition, various amplifying and filtering stages that might be used during actual implementation that are not pertinent to the invention will be omitted. It is understood that those skilled in the art will be able to design and construct actual wireless transceivers in accordance with the principles set forth herein.

The wireless transceiver 104 is shown with a direct conversion architecture, but the inventive concepts described throughout this disclosure are in no way limited to such an architecture. The wireless transceiver 104 may include a transmitter 202 and receiver 204 coupled to a broadband antenna 206 through a duplexer 208. The duplexer 208 may be designed for full-duplex or half-duplex operation depending on the particular application. A wireless telephone, for example, may require full-duplex operation so that both parties on the call can speak at once. To achieve full-duplex operation, the transmit and receive frequencies are typically offset allowing for separate transmit and receive filters in the duplexer 208. In particular, the duplexer 208 may include a transmit filter 210 between the transmitter 202 and the antenna 206, and a receive filter 212 between the antenna 206 and the receiver 204. Each filter may include a tunable SAW resonator that may be used to tune its respective transmit or receive filter to the operating frequency for the wireless service selected by the processor 106 (see FIG. 1).

The receiver 204 is shown with a low noise amplifier (LNA) 214 at the front end. The LNA 214 should provide high gain with good noise figure performance. A band pass filter 216 may be used to reject out of band signals produced by the LNA 214. The band pass filter 216 may include a tunable SAW resonator that allows the band pass of the filter to be tuned to the operating frequency for the wireless service selected by the processor 106 (see FIG. 1). A downconverter 218 may be used to convert the signal output from the band pass filter 216 to baseband and provide the baseband signal to the processor 106 (see FIG. 1).

The transmitter 202 is shown with an upconverter 220 at the input. The upconverter is configured to convert a baseband signal from the processor 106 (see FIG. 1) to a RF signal. A variable gain amplifier (VGA) 222 may be used to amplify the RF signal. A band pass filter 224 may be used to reject out of band signals produced by the VGA 222. The band pass filter 216 may include a tunable SAW resonator that allows the band pass of the filter to be tuned to the operating frequency for the wireless service selected by the processor 106 (see FIG. 1). A power amplifier 226 may be used to amplify the RF signal output from the band pass filter 224 to a level suitable for transmission. The output of the power amplifier 226 may be provided to the antenna 206 through the transmit filter 210 in the duplexer 208.

Although not shown, a tunable SAW resonator may also be used to generate the local oscillator signals needed by the transmitter and receiver to, respectively, upconvert and downconvert the signal. The SAW resonator may be part of a voltage controlled oscillator that is tuned by the processor based on the wireless service selected. In wireless transceivers employing an IF architecture, a phase lock loop synthesizer may be used in the local oscillator to generate transmit and receive IF clocks from the voltage controlled oscillator. The IF clock for the receiver may be mixed with the IF signal and provided to a low pass filter with a tunable SAW resonator to extract the beat frequency, i.e., the baseband signal. Similarly, the IF clock for the transmitter may be mixed with the baseband signal from the processor and provided to a band pass filter with a tunable SAW resonator to pass the IF signal. The SAW resonators in the IF section of the wireless transceiver may be tuned by the processor based on the wireless service selected.

Figure 3:
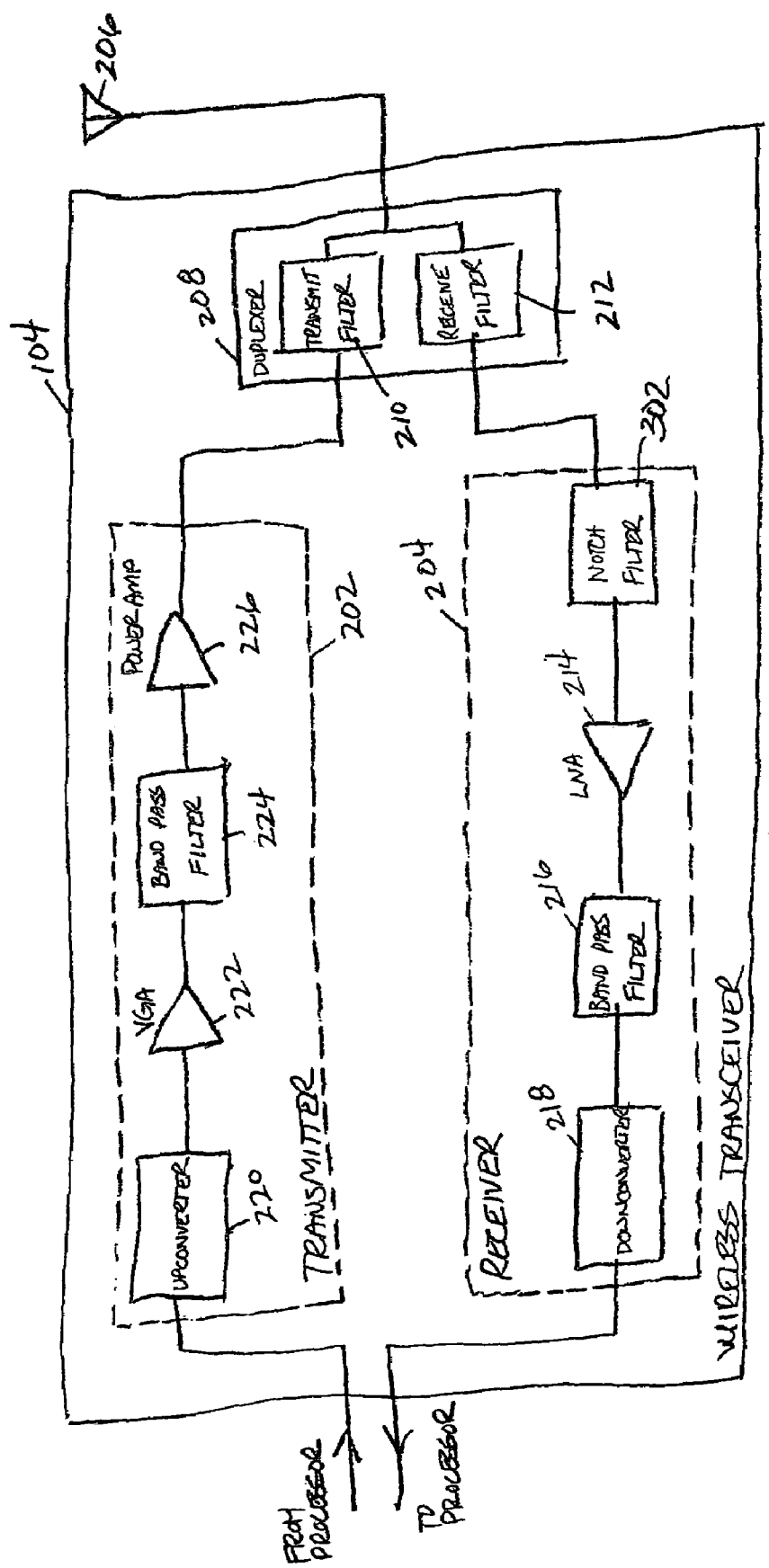
FIG. 3 is a functional block diagram of a wireless transceiver that expands on the concepts discussed in connection with FIG. 2.

FIG. 3 is a functional block diagram of a wireless transceiver that expands on the concepts discussed in connection with FIG. 2. The wireless transceiver 104 shown in FIG. 3 has virtually the same direct conversion architecture as shown in FIG. 2, except for the addition of a notch filter 302 with a tunable SAW resonator positioned between the receive filter 212 in the duplexer 208 and the LNA 214. The notch filter 302 may be used to increase transmit signal rejection in the receiver 204 in the presence of jammers when the transmit power is high. The transmit signal rejection may be increased by tuning the SAW resonator to move the notch into the operating frequency band of the receiver 204. This may be required because the cross modulation between a jammer signal and the transmitter leakage in the receive filter 212 in the duplexer 208. Depending on the transmit power of the wireless transceiver, a cross modulation spectrum may be produced at the output of the LNA that overlaps the desired signal, and as a result, degrades the sensitivity of the receiver. The transmit signal rejection may be decreased by tuning the SAW resonator to move the notch out of the operating frequency band of the receiver 204 when either the transmit power is low or the jammer is weak, thereby decreasing the in-band insertion loss.

Figure 4A:
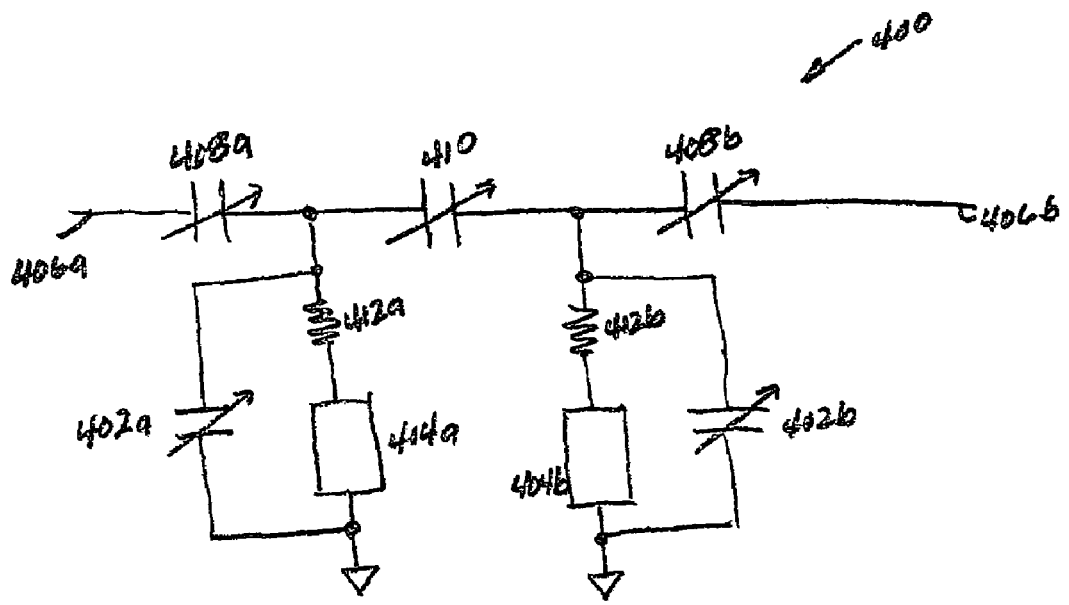
FIG. 4A is a schematic diagram of an illustrative embodiment of a tunable band pass filter.

FIG. 4A is a schematic diagram of an illustrative embodiment of a tunable band pass filter. The tunable band pass filter 400 shown in FIG. 4 is a 2"d order filter that may be used in the various embodiments of the wireless transceivers described above, or in other suitable communication and/or electronic device. The first stage of the filter 400 includes a variable capacitor 402a coupled in shunt with a SAW resonator 404a. The second stage of the filter 400 includes a second variable capacitor 402b coupled in shunt with a second SAW resonator 404b.

A signal may be applied to the input port 406a and the filtered signal taken from the output port 406b. In the described embodiment, the filter 400 is symmetrical, and therefore, the input port 406a and the output port 406b are interchangeable. The filter 400 may include an input variable capacitor 408a in the first stage and an output variable capacitor 408b in the second stage. The first stage variable capacitors 402a, 408b may be used to tune the first stage SAW resonator 404a, and the second stage variable capacitors 402b, 408b may be used to tune the second stage SAW resonator 404b. An additional variable capacitor 410 may be provided for impedance matching between the SAW resonators 404a, 404b to create the desired filter response. The variable DC voltage applied to the capacitors may be provided by the processor as tuning signals based on the wireless service selected.

As mentioned in the background section of this disclosure, SAW resonators are not generally considered tunable because of their high Q. Accordingly, various techniques may be employed to reduce the Q of the SAW resonator to enable tunability. By way of example, the Q of the SAW resonator may be reduced with a series resistor. This technique is shown in FIG. 4A where a resistor 412a is placed in series with the SAW resonator 404a in the first stage, and a second resistor 412b is placed in series with the SAW resonator 404b in the second stage. The Q may be further reduced with increasingly higher series resistance in conjunction with the SAW resonator, resulting in a wider tuning range. Those skilled in the art will be readily able to select the appropriate series resistance for any particular application based on the design tradeoffs between the Q and range of tuning of the SAW resonator.

Figure 4B:
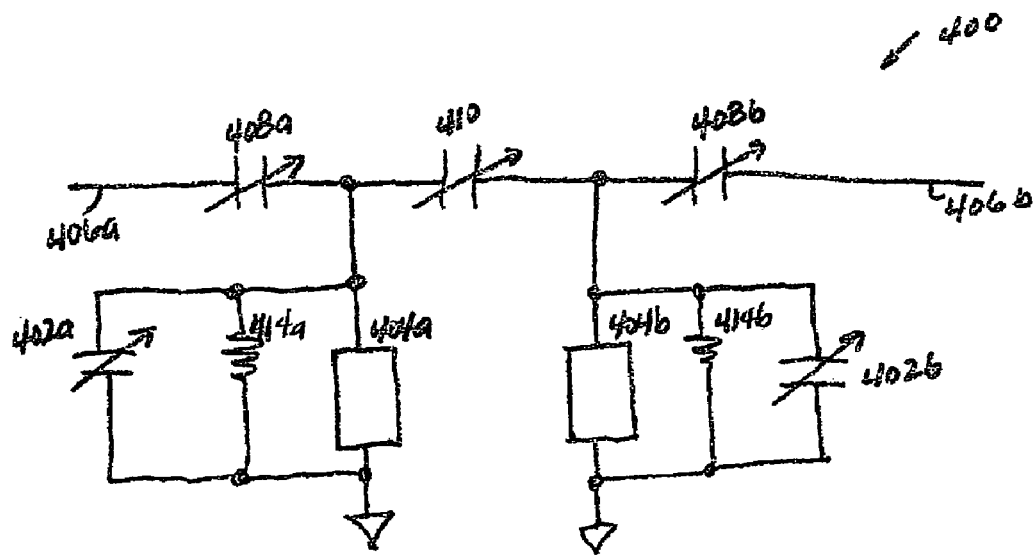
FIG. 4B is a schematic diagram of an alternative embodiment of a tunable band pass filter.

Another technique for reducing the Q of a SAW resonator in a band pass filter is shown in FIG. 4B. FIG. 4B is a schematic' diagram of a tunable band pass filter that is very similar to the one shown in FIG. 4A, with one modification. In FIG. 4A, the tunable band pass filter shown in FIG. 4B uses parallel resistors to reduce the Q of the SAW resonators. A resistor 414a is placed in series with the SAW resonator 404a in the first stage, and a second resistor 414b is placed in series with the SAW resonator 404b in the second stage. Similar to the filter shown in FIG. 4A, lower Q and wider tuning range are achieved with increased resistance, and those skilled in the art will be readily able to select the appropriate parallel resistance for any particular application.

Figure 5A:
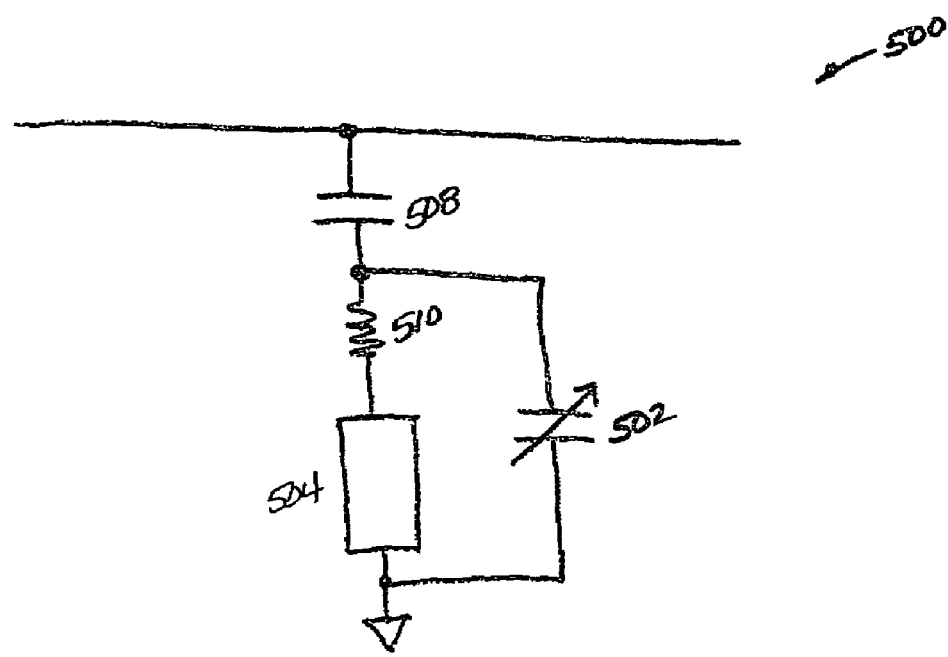
FIG. 5A is a schematic diagram of an illustrative embodiment of a tunable notch filter.
Figure 5B:
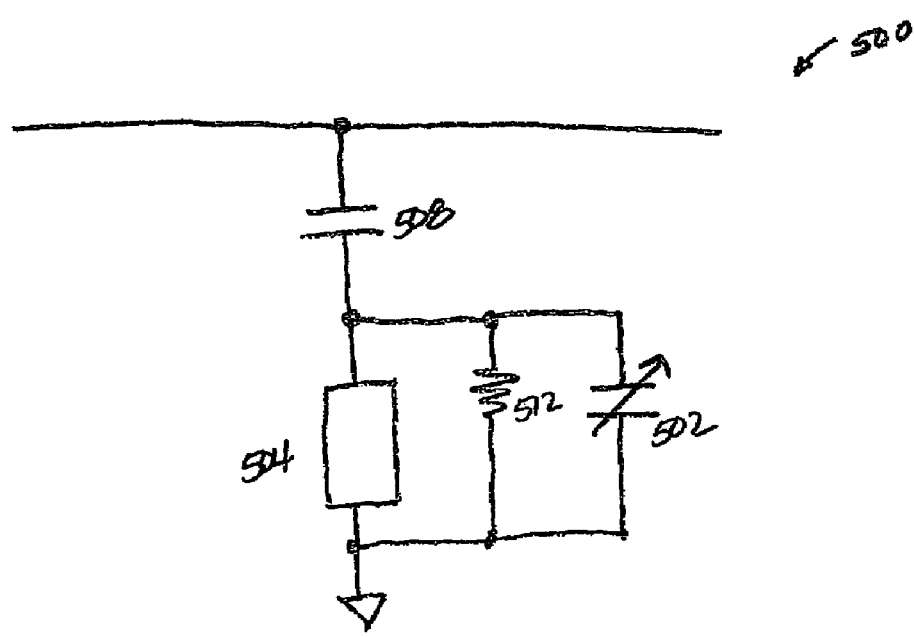
FIG. 5B is a schematic diagram of an alternative embodiment of a tunable notch filter.

FIGS. 5A and 5B are schematic diagrams illustrating different embodiments of a tunable notch filter. Either one of these tunable notch filters may be used in the various embodiments of the wireless transceivers described above, or in other suitable communication and/or electronic device. Each tunable notch filter 500 may include a variable capacitor 502 coupled in shunt with a SAW resonator 504. A fixed value capacitor 508 may be used between the output and the shunt combination of the variable capacitor 502 and the SAW resonator 504. A series resistor 510 may be used to lower the Q of the SAW resonator 504 as shown in FIG. SA, or alternatively, a parallel resistor 512 may be used to lower the Q of the SAW resonator 504 as shown in FIG. 5B.

The variable capacitors used with SAW resonators may be any suitable type known in the art. By way of example, thin film ferro-electric capacitors may be used. A thin film ferro-electric capacitor may be constructed from a ferro-electric material sandwiched between two conductor plates. Ferro-electric materials are a class of materials, typically ceramic rare earth oxides, whose prominent feature is that their dielectric constant changes in response to an applied slowly varying (DC or low frequency) electric field. Since the capacitance of a capacitor depends on the dielectric constant of the material between the conductor plates, the ferro-electric capacitor is well suited for this application.

The various illustrative logical blocks, modules, circuits, elements, and/or components described in connection with the embodiments disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing components, e.g., a combination of a DSP and a microprocessor, a plurality of microprocessors, one or more microprocessors in conjunction with a DSP core, or any other such configuration.

The methods or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein, but is to be accorded the full scope consistent with the claims, wherein reference to an element in the singular is not intended to mean "one and only one" unless specifically so stated, but rather "one or more." All structural and functional equivalents to the elements of the various embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

What is claimed is:

1. A circuit, comprising:
   a transceiver, comprising:
   a receiver;
   a transmitter; and
   a duplexer coupled to the receiver and transmitter, wherein the transmitter or receiver includes a tunable SAW resonator, the SAW resonator has a Q, the transmitter or receiver further comprises a resistor coupled to the SAW resonator to reduce the Q, and a tuning component configured to tune the SAW resonator, the tuning component and the SAW resonator are arranged to form a filter, the filter comprises a notch filter wherein the notch filter is used in the receiver to vary the transmit signal rejection of the duplexer.

2. A transceiver, comprising:
   a receiver;
   a transmitter; and
   a duplexer coupled to the receiver and transmitter;
   wherein the transmitter or receiver includes a tunable SAW resonator, the SAW resonator has a Q, the transmitter or receiver further comprises a resistor coupled to the SAW resonator to reduce the Q, and a tuning component configured to tune the SAW resonator, the tuning component and the SAW resonator are arranged to form a filter, the filter comprises a notch filter wherein the notch filter is used in the receiver to vary the transmit signal rejection of the duplexer.

3. The transceiver of claim 2 wherein the resistor is coupled in series with the SAW resonator.

4. The transceiver of claim 2 wherein the resistor is coupled in parallel with the SAW resonator.

5. The transceiver of claim 2 wherein the tuning component comprises a voltage controlled variable capacitor.

6. The transceiver of claim 5 wherein the voltage controlled variable capacitor comprises a ferro-electric capacitor.

7. The transceiver of claim 6 wherein the duplexer comprises a band pass filter.

8. A transceiver, comprising:
   a receiver;
   a transmitter; and
   a duplexer having a transmit filter coupled to the transmitter and a receive filter coupled to the receiver, each of the filters having a tunable SAW resonator, the SAW resonators have a Q, the transmit filter further comprises a resistor coupled to the SAW resonator in the transmit filter to reduce the Q of the SAW resonator in the transmit filter, and the receive filter further comprises a resistor coupled to the SAW resonator in the receive filter to reduce the Q of the SAW resonator in the receive filter, the receiver comprises a notch filter having a tunable SAW resonator, wherein the notch filter is used in the receiver to vary the transmit signal rejection of the duplexer.

9. The transceiver of claim 8 wherein the resistor and SAW resonator in the transmit filter are coupled in series, and wherein the resistor and SAW resonator in the receive filter are coupled in series.

10. The transceiver of claim 8 wherein the resistor and SAW resonator in the transmit filter are coupled in parallel, and wherein the resistor and SAW resonator in the receive filter are coupled in parallel.

11. The transceiver of claim 8 wherein the transmit filter further comprises a tuning component configured to tune the SAW resonator in the transmit filter, and wherein the receive filter further comprises a tuning component configured to tune the SAW resonator in the receive filter.

12. The transceiver of claim 11 wherein each of the tuning components comprises a voltage controlled variable capacitor.

13. The transceiver of claim 12 wherein each of the voltage controlled variable capacitors comprises a ferro-electric capacitor.

14. A method of tuning a SAW resonator in a circuit, comprising:
    generating a control signal; and
    tuning the SAW resonator with the control signal, wherein the circuit comprises a transceiver, comprising:
    a receiver;
    a transmitter; and
    a duplexer coupled to the receiver and transmitter; wherein the transmitter or receiver includes a tunable SAW resonator, the SAW resonator has a Q, the transmitter or receiver further comprises a resistor coupled to the SAW resonator to reduce the Q, and a tuning component configured to tune the SAW resonator, the tuning component and the SAW resonator are arranged to form a filter, the filter comprises a notch filter wherein the notch filter is used in the receiver to vary the transmit signal rejection of the duplexer.

15. The method of claim 14 wherein the tuning component comprises a voltage controlled variable capacitor, and wherein the SAW resonator is tuned by tuning the voltage controlled variable capacitor with the control signal.

* * * * *